(12) United States Patent
Ahn et al.

(10) Patent No.: US 7,384,850 B2
(45) Date of Patent: Jun. 10, 2008

(54) METHODS OF FORMING COMPLEMENTARY METAL OXIDE SEMICONDUCTOR (CMOS) TRANSISTORS HAVING THREE-DIMENSIONAL CHANNEL REGIONS THEREIN

(75) Inventors: Young-Joon Ahn, Gyeonggi-do (KR); Dong-Gun Park, Gyeonggi-do (KR); Choong-Ho Lee, Gyeonggi-do (KR); Hee-Soo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 333 days.

(21) Appl. No.: 11/087,988

(22) Filed: Mar. 23, 2005

(65) Prior Publication Data

US 2005/0215014 A1 Sep. 29, 2005

(30) Foreign Application Priority Data

Mar. 23, 2004 (KR) .................. 10-2004-0019754

(51) Int. Cl.
*H01L 21/8234* (2006.01)
(52) U.S. Cl. ................ 438/275; 438/283; 257/E21.442
(58) Field of Classification Search ........... 438/228, 438/230, 275, 283; 257/E21.442
See application file for complete search history.

(56) References Cited

U.S. PATENT DOCUMENTS

| 6,448,615 | B1 | 9/2002 | Forbes et al. |
| 6,605,501 | B1 | 8/2003 | Ang et al. |
| 6,632,712 | B1 * | 10/2003 | Ang et al. ................ 438/212 |
| 6,657,259 | B2 * | 12/2003 | Fried et al. ............... 257/350 |
| 6,689,650 | B2 | 2/2004 | Gambino et al. |
| 6,909,147 | B2 * | 6/2005 | Aller et al. ............... 257/347 |
| 2003/0190791 | A1 | 10/2003 | Fischetti al. |
| 2005/0199919 | A1 * | 9/2005 | Liu et al. ................. 257/288 |

FOREIGN PATENT DOCUMENTS

JP 2003-188723 A 7/2003

OTHER PUBLICATIONS

Korean Office Action for Korean patent application No. 10-2004-0019754; issued Aug. 31, 2005.

* cited by examiner

*Primary Examiner*—Chandra Chaudhari
(74) *Attorney, Agent, or Firm*—Myers Bigel Sibley & Sajovec, P.A.

(57) ABSTRACT

An integrated circuit device containing complementary metal oxide semiconductor transistors includes a semiconductor substrate and an NMOS transistor having a first fin-shaped active region that extends in the semiconductor substrate. The first fin-shaped active region has a first channel region therein with a first height. A PMOS transistor is also provided. The PMOS transistor has a second fin-shaped active region that extends in the semiconductor substrate. This second fin-shaped active region has a second channel region therein with a second height unequal to the first height.

9 Claims, 8 Drawing Sheets

METHODS OF FORMING COMPLEMENTARY METAL OXIDE SEMICONDUCTOR (CMOS) TRANSISTORS HAVING THREE-DIMENSIONAL CHANNEL REGIONS THEREIN

REFERENCE TO PRIORITY APPLICATION

This application claims priority to Korean Application Ser. No. 2004-19754, filed Mar. 23, 2004, the disclosure of which is hereby incorporated herein by reference.

FIELD OF THE INVENTION

The present invention relates to integrated circuit devices and, more particularly, to metal oxide semiconductor field effect transistors and methods of forming metal oxide semiconductor field effect transistors.

BACKGROUND OF THE INVENTION

Metal oxide semiconductor (MOS) transistors having reduced channel lengths may suffer from parasitic short-channel effects. These effects can result in an effective reduction in transistor threshold voltage. One technique for reducing short-channel effects includes increasing the doping concentration in the channel region of the transistor. Unfortunately, this higher doping concentration may result in a higher inversion-layer channel resistance when the transistor is disposed in a forward on-state mode of operation. This higher channel resistance may cause a reduction in the current driving ability of the transistor. Another technique to reduce short-channel effects includes forming transistors having three-dimensional channel regions. One method of forming a transistor with a three-dimensional channel region is disclosed in U.S. Pat. No. 6,689,650 to Gambino et al. In this method, a gate electrode is formed in a self-aligned manner to a channel region. Other methods are disclosed in U.S. Pat. No. 6,448,615 to Forbes et al. and U.S. Pat. Nos. 6,605,501 to Ang et al.

Notwithstanding these methods, complications may arise when forming complementary metal oxide semiconductor (CMOS) transistors in a semiconductor substrate. These complications may relate to the inability to obtain optimum device characteristics for both NMOS and PMOS transistors because of the fact that electron and hole mobilities in these transistors are different. In order to obtain improved device characteristics, unique processing conditions may be necessary for each of the types of MOS transistors (i.e., N-type and P-type MOS transistors). However, these unique processing conditions may be difficult to apply to conventional CMOS methods of forming channel regions having three-dimensional shapes (e.g., fin-shaped channel regions).

SUMMARY OF THE INVENTION

Embodiments of the invention include an integrated circuit device contains a semiconductor substrate and a NMOS transistor having a first fin-shaped active region that extends in the semiconductor substrate. The first fin-shaped active region has a first three-dimensional channel region therein with a first height. A PMOS transistor is also provided. The PMOS transistor has a second three-dimensional fin-shaped active region that extends in the semiconductor substrate. The second fin-shaped active region has a second channel region therein with a second height unequal to the first height. These unequal heights of the channel regions enable the NMOS and PMOS transistors to have unique and even optimum characteristics. For example, a greater height of the channel region in the PMOS transistor relative to a height of the channel region in the NMOS transistor translates to a wider channel width. This wider channel width can compensate for the lower P-channel mobility of the PMOS transistor (e.g., lower hole mobility in an inversion-layer channel during forward on-state conduction) relative to N-channel mobility in the NMOS transistor.

The different channel region heights also translate to different source and drain region depths in the fin-shaped active regions. In particular, the NMOS transistor may include first source and drain regions of first conductivity type that extend to a first depth in the first fin-shaped active region. The PMOS transistor may include second source and drain regions of second conductivity type that extend to a second depth in the second fin-shaped active region, which is unequal to the first depth. The second depth may be greater than the first depth. The NMOS transistor may also include an N-type polysilicon gate electrode and the PMOS transistor may include a P-type polysilicon gate electrode. The N-type polysilicon gate electrode is separated from the first fin-shaped active region by a first gate insulating material and the P-type polysilicon gate electrode is separated from the second fin-shaped active region by a second gate insulating material. The first gate insulating material may be different from the first gate insulating material.

The semiconductor substrate may also include a trench-based isolation region, which has an opening therein through which the first fin-shaped active region extends. This trench-based isolation region may have a recess therein and the gate electrode of the NMOS transistor may extend into the recess and opposite a sidewall of the first fin-shaped active region. An N-type source region of the NMOS transistor may also extend to an interface between the trench-based isolation region and the first fin-shaped active region.

Additional embodiments of the present invention include methods of forming an integrated circuit device by selectively etching back a portion of a surface of a semiconductor substrate to define a trench therein that surrounds a first fin-shaped semiconductor active region and surrounds a second fin-shaped semiconductor active region that is spaced apart from the first fin-shaped semiconductor active region. The trench is filled with an electrical isolation region (e.g., trench oxide) that covers sidewalls of the first and second fin-shaped semiconductor active regions. A step is then performed to selectively etch a first portion of the electrical isolation region to expose a portion of the sidewalls of the first fin-shaped semiconductor active region. A first gate electrode insulating layer is then formed on the exposed portion of the sidewalls of the first fin-shaped semiconductor active region. This step is followed by the step of forming a first gate electrode layer on the first gate electrode insulating layer and then planarizing the first gate electrode layer to define a first gate electrode. These methods also include selectively etching a second portion of the electrical isolation region to expose a portion of the sidewalls of the second fin-shaped semiconductor active region and forming a second gate electrode insulating layer on the exposed portion of the sidewalls of the second fin-shaped semiconductor active region. A second gate electrode layer is then formed on the second gate electrode insulating layer. The second gate electrode layer is then planarized to define a second gate electrode. Source and drain region dopants can then be implanted into the first fin-shaped semiconductor active region using the first gate electrode as an implant mask. Similar steps can also be performed to implant dopants into the second fin-shaped semiconductor active region. The steps of selectively etching the first and second portions of the electrical isolation region may be performed so that a height of a first channel region in the first fin-shaped active region is different from a height of a second channel in the second fin-shaped active region.

DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity of description. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like reference numerals refer to like elements throughout.

Figure 1:
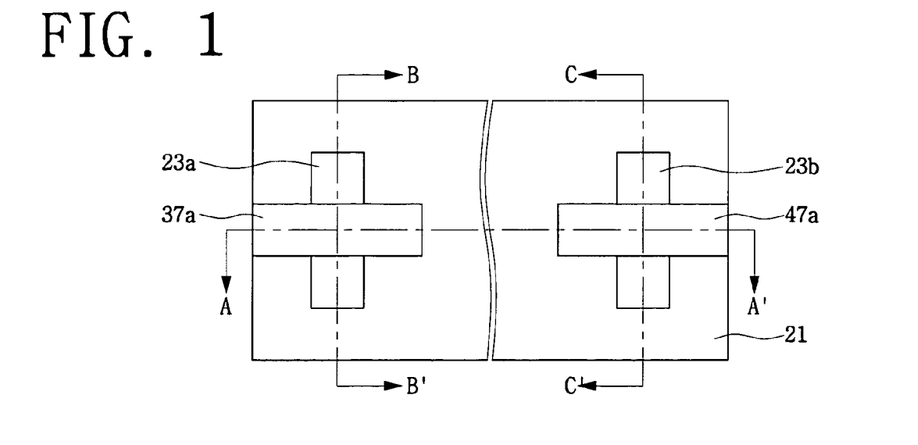
FIG. 1 is a layout view of a pair of CMOS transistors that support three-dimensional channel regions, according to embodiments of the present invention.

FIGS. 1 and 12A-12C illustrate a pair of CMOS transistors having three-dimensional channel regions, according to embodiments of the present invention. In particular, FIG. 1 is a layout view of the pair of CMOS transistors and the lines A-A', B-B' and C-C' identify the locations of the cross-sectional views illustrated by FIGS. 12A, 12B and 12C, respectively. As illustrated by FIG. 1, a first active region 23a of an NMOS transistor and a second active region 23b of a PMOS transistor are provided in a semiconductor substrate 21. These active regions 23a and 23b may be configured as active regions having widths in a range from about 5 nm to about 40 nm, for example. The semiconductor substrate 21 may be a bulk semiconductor substrate (e.g., silicon wafer or chip) or a silicon-on-insulator (SOI) substrate, for example. In the event the substrate 21 is a bulk substrate, the first and second active regions 23a and 23b may be electrically connected to each other through an underlying portion of the bulk substrate. However, if the substrate is an SOI substrate having a silicon layer on top of an underlying electrically insulating layer, then the first and second active regions 23a and 23b may be formed in separate portions of the silicon layer and electrically isolated from each other. As further illustrated by FIG. 1, first and second gate electrodes 37a and 47a are provided on the first and second active regions 23a and 23b, respectively. The first gate electrode 37a may be formed as an N-type polysilicon gate electrode and the second gate electrode 37b may be formed as a P-type polysilicon gate electrode. The layout view of FIG. 1 will now be described more fully with reference to FIGS. 12A-12C.

Figure 12A:
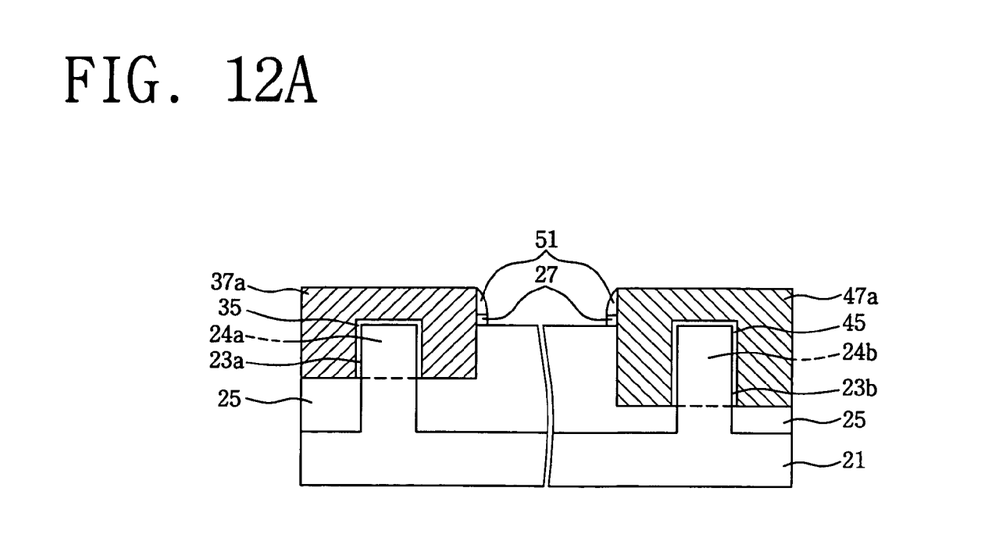
FIGS. 12A-12C are cross-sectional views of the pair of CMOS transistors of FIG. 1, taken along lines A-A', B-B' and C-C', respectively.

In FIG. 12A, an electrically isolating layer 25 is illustrated as extending in a trench in the silicon substrate 21. This electrically isolating layer 25 is illustrated as having openings therein through which the first and second active regions 23a and 23b extend. A first gate insulating layer 35 is provided on an upper surface and on sidewalls of the first active region 23a. This first gate insulating layer 35 may be formed of a gate oxide material (e.g., $SiO_2$) or a higher dielectric material such as silicon nitride (SiN). The first gate electrode 37a is shown as surrounding upper and sidewall portions of the first active region 23a and thereby defining a first channel region 24a within the first active region 23a. As will be understood by those skilled in the art, the application of an appropriate turn-on voltage between the first gate electrode 37a and the first channel region 24a will result in the formation of a highly conductive inversion-layer channel (not shown) in a portion of the first channel region 24a extending closely adjacent the first gate insulating layer 35. This inversion-layer channel is a three-dimensional channel that extends adjacent the upper surface and opposing sidewalls of the first active region 23a.

Similarly, a second gate insulating layer 45 is provided on an upper surface and on sidewalls of the second active region 23b. This second gate insulating layer 45 may be formed of a gate oxide material (e.g., $SiO_2$) or a higher dielectric material such as silicon nitride (SiN). The second gate electrode 47a is shown as surrounding upper and sidewall portions of the second active region 23b and thereby defining a second channel region 24b within the second active region 23b. The application of an appropriate turn-on voltage between the second gate electrode 47a and the second channel region 24b will result in the formation of a highly conductive inversion-layer channel (not shown) in a portion of the second channel region 24b extending closely adjacent the second gate insulating layer 45. This inversion-layer channel is a three-dimensional channel that extends adjacent the upper surface and opposing sidewalls of the second active region 23b. The height of the second channel region 24b is illustrated as being greater than the height of the first channel region 24a, however, in alternative embodiments of the invention, the heights of the first and second channel regions 24a and 24b can be the same or the height of the first channel region 24a can be greater than the height of the second channel region 24b.

Figure 12B:
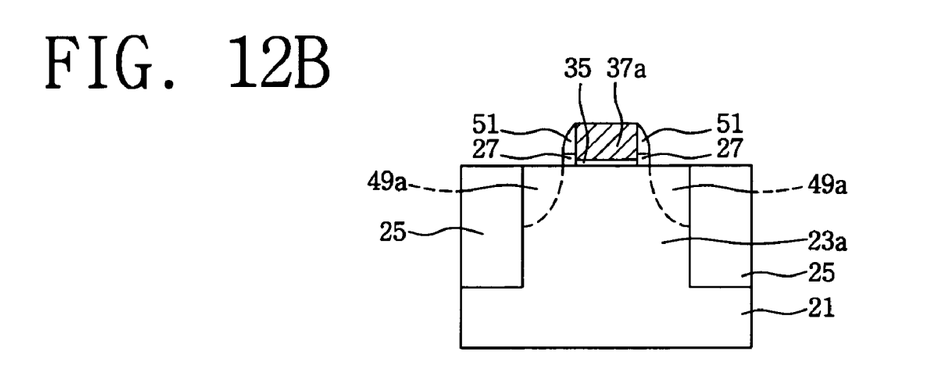
Figure 12C:
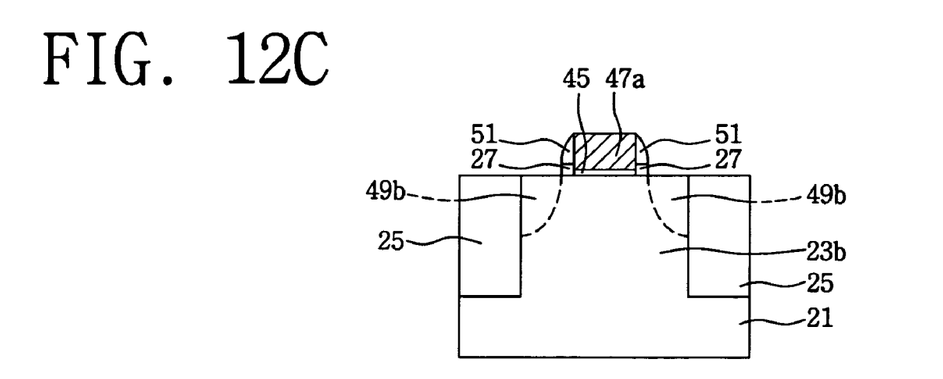

As illustrated by FIGS. 12A-12B, sidewall spacers 51 extend on sidewalls of the first gate electrode 37a. These sidewall spacers 51 may be formed as silicon nitride (SiN) spacers. These sidewall spacers 51 may be spaced from the first active region 23a by a portion of a buffer layer 27, as explained more fully hereinbelow. In addition, first source and drain regions 49a are provided within the first active region 23a. These first source and drain regions 49a are sufficiently deep to support the three-dimensional inversion-layer channel that is established in the first channel region 24a during forward on-state conduction. Referring now to FIGS. 12A and 12C, additional sidewall spacers 51 may also extend on sidewalls of the second gate electrode 47a. These sidewall spacers 51 may also be spaced from the second active region 23b by portions of the buffer layer 27. Second source and drain regions 49b are provided within the second active region 23b. These second source and drain regions 49b are sufficiently deep to support the three-dimensional inversion-layer channel that is established in the second channel region 24b during forward on-state conduction.

Figure 2:
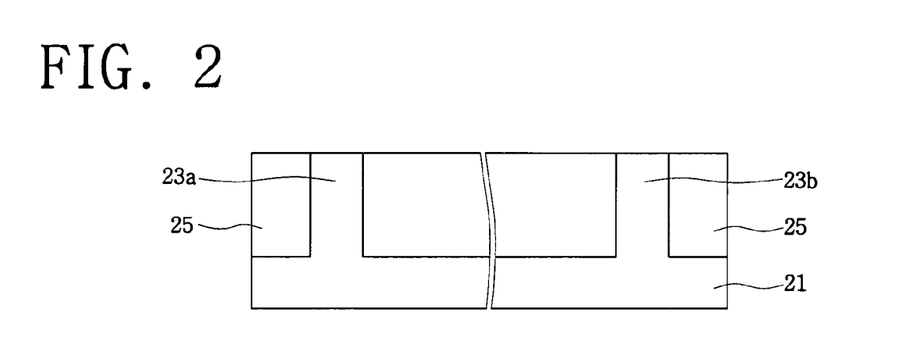
FIGS. 2-3, 4A, 5-6, 7A, 8A, 9-10 and 11A are cross-sectional views of intermediate structures that illustrate methods of forming the pair of CMOS transistors illustrated by line A-A' in FIG. 1 and FIG. 12A, according to embodiments of the present invention.

Methods of forming the pair of CMOS transistors illustrated by FIGS. 1 and 12A-12C will now be described more fully with reference to FIGS. 2-3, 4A-4C, 5-6, 7A-7C, 8A-8C, 9-10 and 11A-11C. Referring nowto FIG. 2, an electrically isolating layer 25 is formed adjacent a primary surface of the semiconductor substrate 21. If the substrate 21 is a bulk substrate (e.g., single crystal substrate), then the electrically isolating layer 25 may be formed using a shallow trench isolation (STI) process that defines the first and second active regions 23a and 23b in openings in the electrically isolating layer 25. In particular, a trench may be formed in the substrate 21 by etching back a portion of the substrate 21 exposed by a patterned mask (not shown). Thereafter, a sacrificial thermal oxide layer may be formed on the bottom and sidewalls of the trench to thereby remove etch related defects in the substrate 21 and reduce the dimensions of the first and second active regions 23a and 23b to desired values. After formation, this sacrificial thermal oxide layer may be removed and the trench may be entirely filled with an electrically insulating material. Alternatively, if the substrate 21 is an SOI substrate, then the first and second active regions 23a and 23b may be defined by patterning a relatively thick semiconductor layer to define the active regions and then depositing an electrically insulating material on sidewalls of the active regions. The dimensions of the first and second active regions 23a and 23b may also be reduced by thermally oxidizing these regions and then removing the thermal oxides prior to depositing the electrically insulating material.

Figure 3:
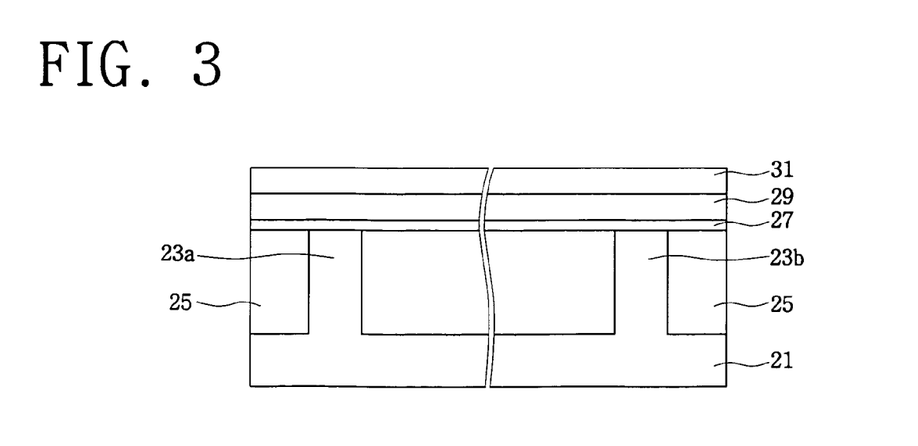
Figure 4A:
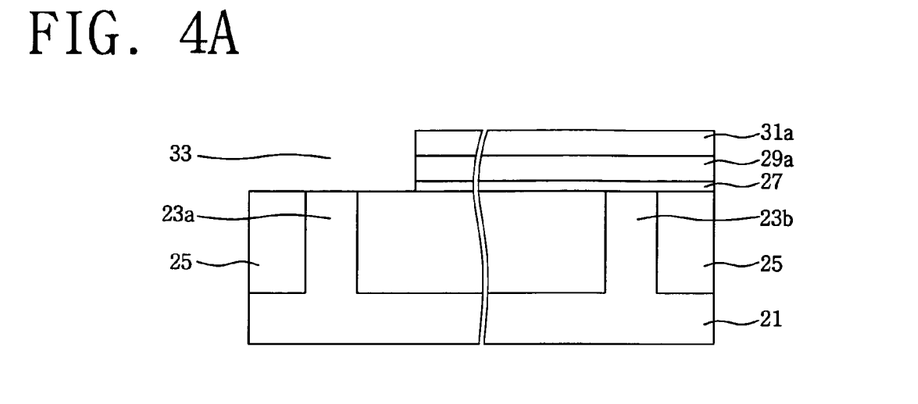
Figure 4B:
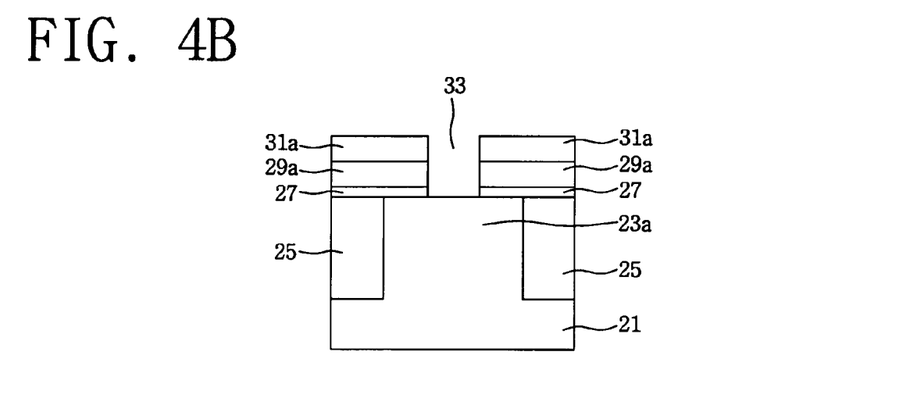
FIGS. 4B, 7B, 8B and 11B are cross-sectional views of intermediate structures that illustrate methods of forming the NMOS transistor illustrated by line B-B' in FIG. 1 and in FIG. 12B, according to embodiments of the present invention.
Figure 4C:
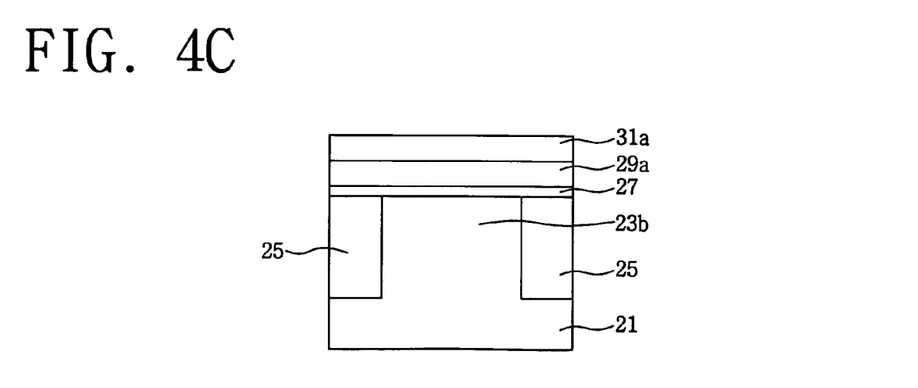
FIGS. 4C, 7C, 8C and 11C are cross-sectional views of intermediate structures that illustrate methods of forming the PMOS transistor illustrated by line C-C' in FIG. 1 and in FIG. 12C, according to embodiments of the present invention.

Referring now to FIG. 3, an electrically insulating buffer layer 27 may be formed on upper surfaces of the first and second active regions 23a and 23b and on the electrically isolating layer 25. Thereafter, a hard mask layer 29 may be deposited on the buffer layer 27. The hard mask layer 29 is preferably made of a material having a high degree of etching selectivity relative to the electrically isolating layer 25. For example, in the event the electrically isolating layer 25 is a silicon dioxide layer, then the hard mask layer 29 may be a silicon nitride layer. The buffer layer 27 may also perform a function of relieving stress between the electrically isolating layer 25 and the hard mask layer 29. A supplemental mask layer 31 may also be formed on the hard mask layer 29. The supplemental mask layer 31 is preferably formed of a material having a high degree of etching selectivity relative to the hard mask layer 29. In the event the hard mask layer 29 is formed of silicon nitride, the supplemental mask layer 31 may be formed of silicon dioxide.

As illustrated by FIGS. 1 and 4A-4C, the supplemental mask layer 31 is photolithographically patterned to define a supplemental mask pattern 31a having an opening therein that exposes the hard mask layer 29. The hard mask layer 29 is then etched using the supplemental mask pattern 31a as an etching mask, to thereby define a patterned hard mask layer 29a. The underlying buffer layer 27 may also be etched back to define a resulting opening 33 that exposes the first active region 23a and the electrically isolating layer 25. As illustrated, these sequential etching and patterning steps do not result in an exposure of the second active region 23b.

Figure 5:
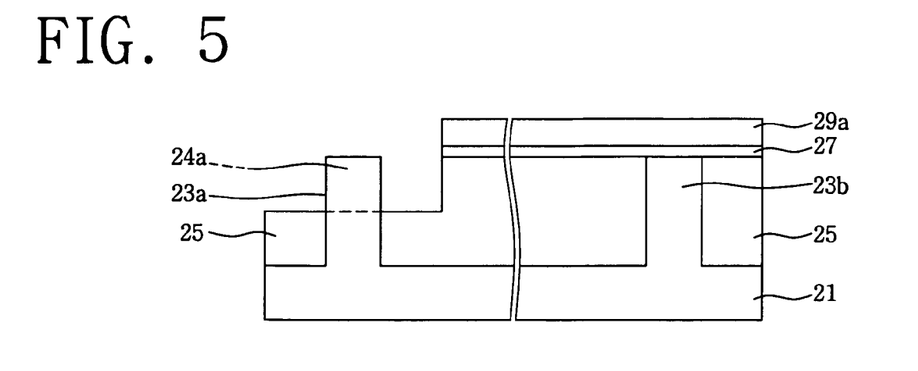
Figure 6:
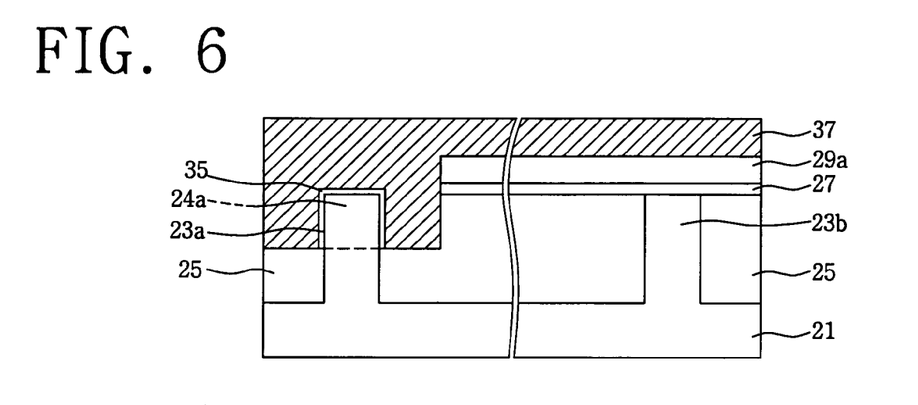

Referring now to FIG. 5, a portion of the exposed electrically isolating layer 25 is then anisotropically etched back to a desired depth using the patterned hard mask layer 29a as an etching mask. During this etch-back step, the supplemental mask pattern 31a may also be removed through etching. This etch back step results in an exposure of a portion of an upper surface and portions of sidewalls of the first active region 23a. These exposed portions of the first active region 23a define the dimensions of the first channel region 24a. Thereafter, as illustrated by FIG. 6, a first gate insulating layer 35 is formed on the sidewalls and upper surface of the first channel region 24a. This first gate insulating layer 35 may be formed as a silicon dioxide layer by thermally oxidizing the first channel region 24a. Alternatively, the first gate insulating layer 35 may be formed using an atomic layer deposition (ALD) technique or a chemical vapor deposition (CVD) technique. Using such techniques, the first gate insulating layer 35 may be formed as an insulating layer having a high dielectric strength (e.g., silicon nitride). Moreover, prior to formation of the first gate insulating layer 35, threshold-voltage implants may be added to the first channel region 24a by implanting P-type dopants in the first channel region 24a using the patterned hard mask layer 29a as an implant mask. The formation of the first gate insulating layer 35 may be followed by the formation of a first gate conductive layer 37 on the first gate insulating layer 35, as illustrated. The first gate conductive layer 37 may be formed as an N-type polysilicon layer, which extends opposite the upper surface and sidewalls of the first channel region 24a.

Figure 7A:
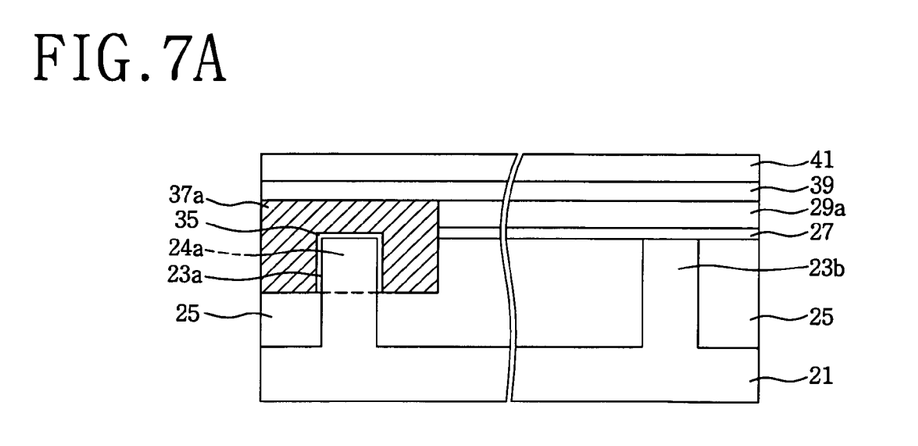
Figure 7B:
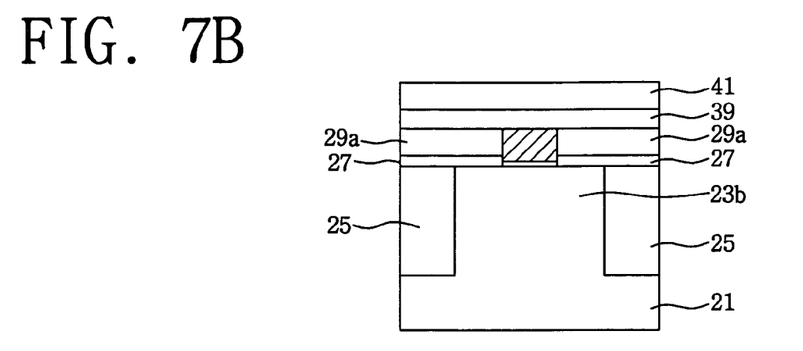
Figure 7C:
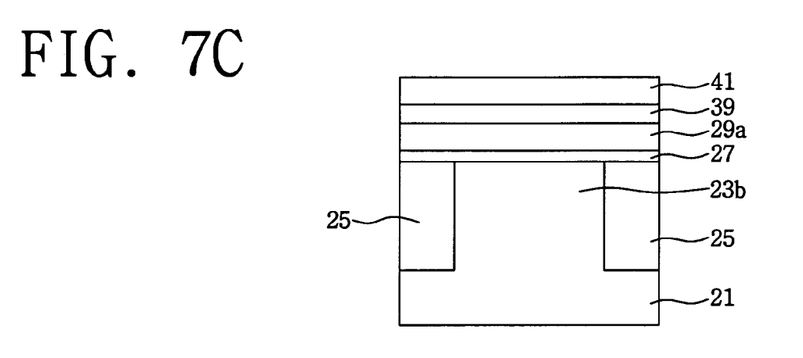

Thereafter, as illustrated by FIGS. 7A-7C, the first gate conductive layer 37 is planarized until the patterned hard mask layer 29a is exposed. The planarization step results in the formation of a first gate electrode 37a, which surrounds the first channel region 24a. A blanket capping layer 39 is then deposited on the first gate electrode 37a and the patterned hard mask layer 29a, as illustrated. The capping layer 39 is preferably formed of a material having a high degree of etching selectivity relative to the electrically isolating layer 25 and may be formed of the same material used to form the patterned hard mask layer 29a. A second supplemental mask layer 41 may then be formed on the capping layer 39. This second supplemental mask layer 41 may be formed of a material having a high degree of etching selectively with respect to the capping layer 39. In particular, the second supplemental mask layer 41 may be formed of the same material as the electrically isolating layer 25.

Figure 8A:
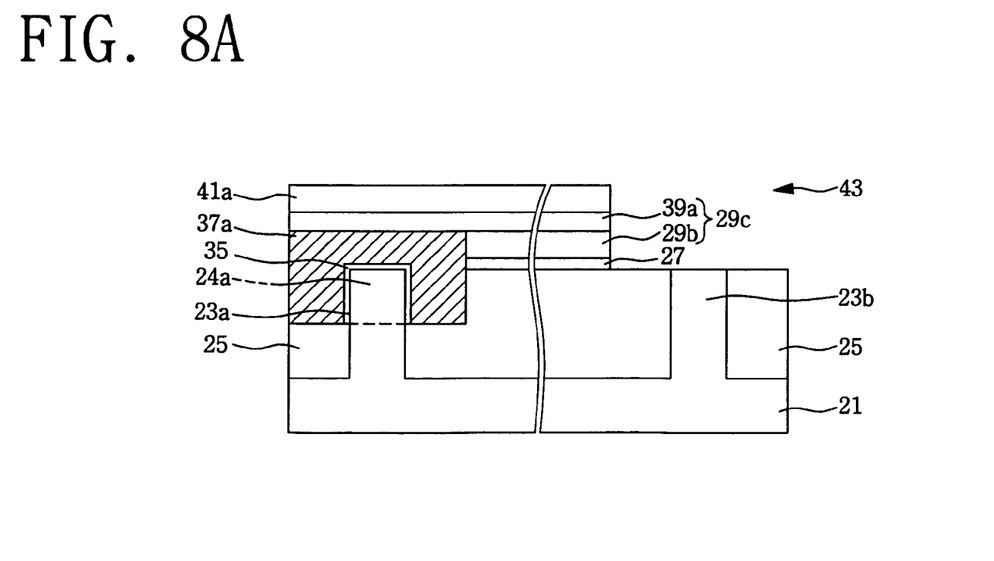
Figure 8B:
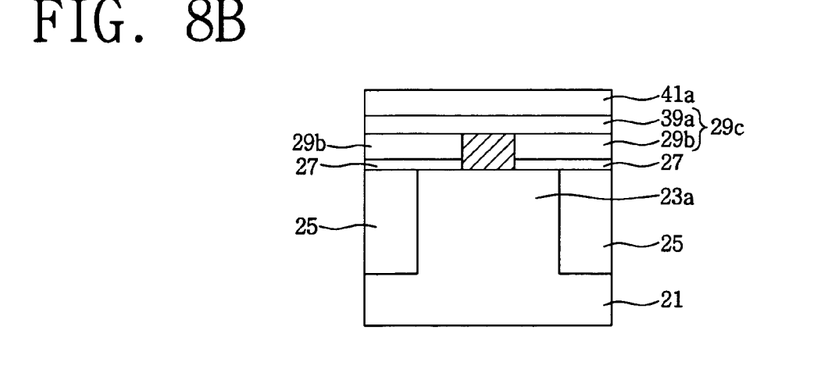
Figure 8C:
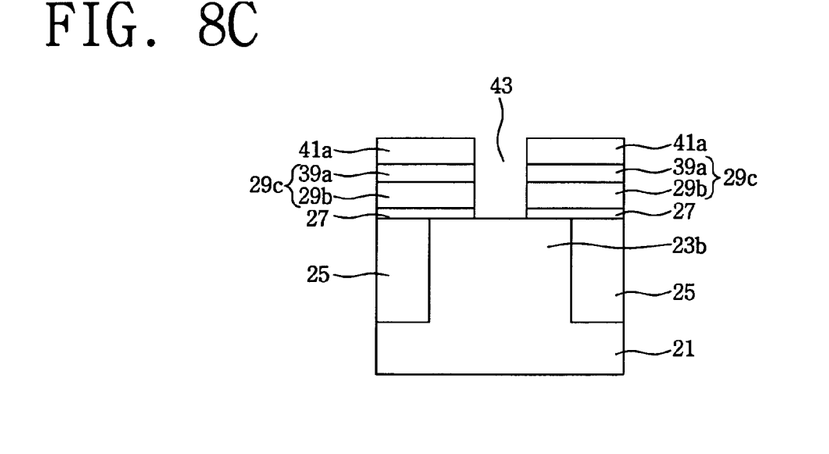

Referring now to FIGS. 8A-8C, the second supplemental mask layer 41 is photolithographically patterned to define a second supplemental mask pattern 41a having an opening therein that exposes the capping layer 39. The capping layer 39 and the patterned hard mask layer 29a are then etched in sequence using the second supplemental mask pattern 41a as an etching mask, to thereby define a second patterned hard mask layer 29c. This second patterned hard mask layer 29c is a composite of a patterned capping layer 39a and a further patterned hard mask layer 29b. The underlying buffer layer 27 may also be etched back to define a resulting opening 43 that exposes the second active region 23b and the electrically isolating layer 25.

Figure 9:
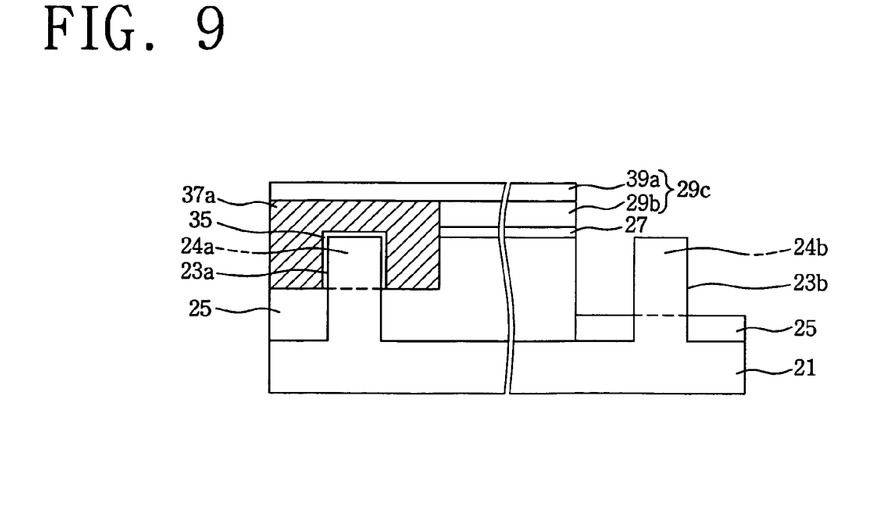
Figure 10:
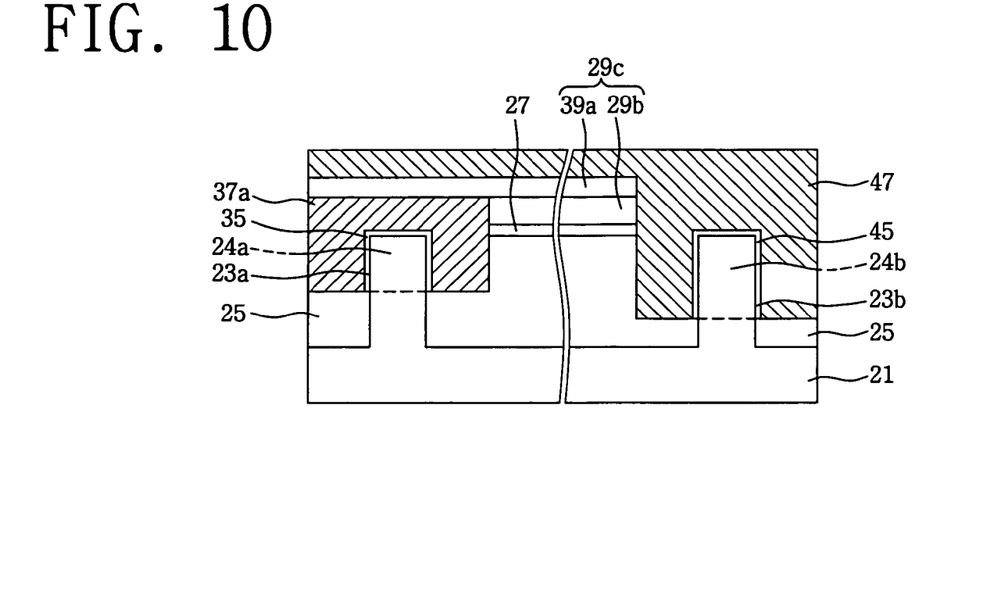
Figure 11A:
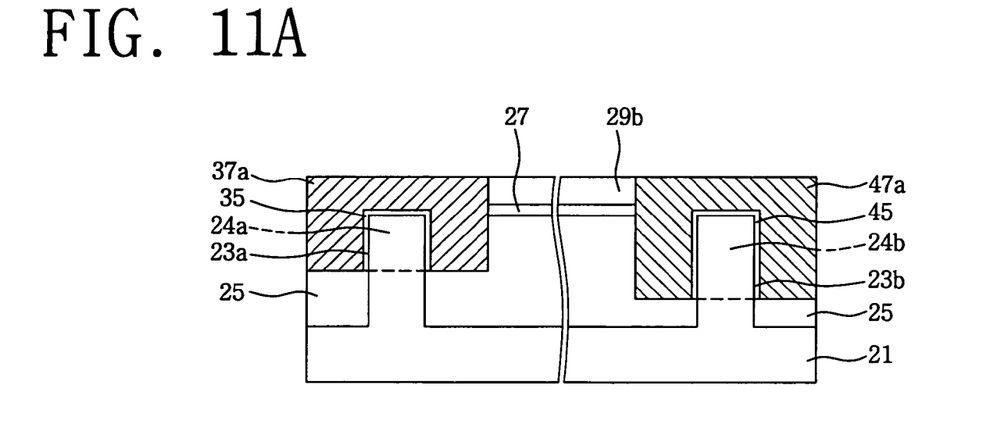
Figure 11B:
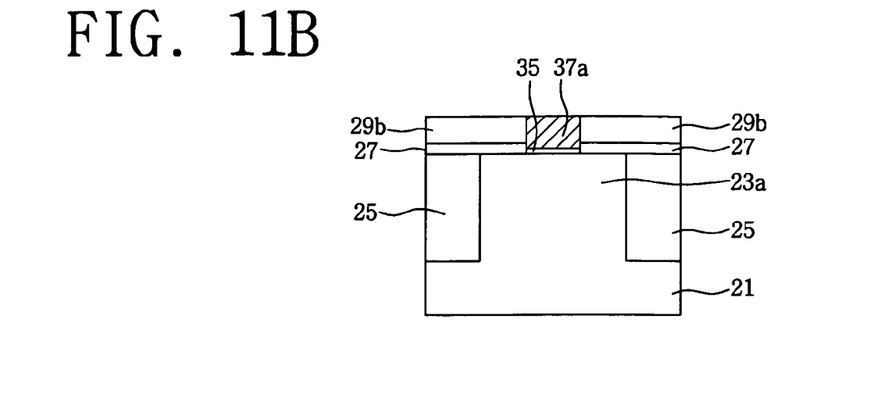
Figure 11C:
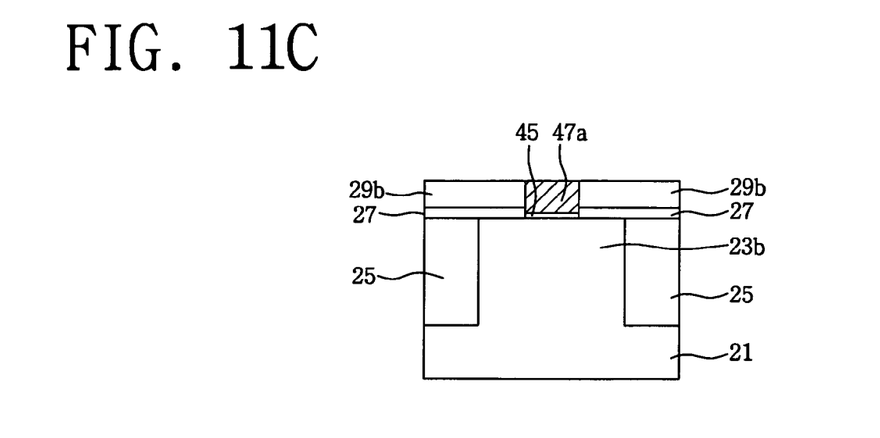

Referring now to FIG. 9, another portion of the exposed electrically isolating layer 25 is then anisotropically etched back to a desired depth using the second patterned hard mask layer 29c as an etching mask. During this etch-back step, the second supplemental mask pattern 41a may also be removed through etching. This etch back step results in an exposure of a portion of an upper surface and portions of sidewalls of the second active region 23b. These exposed portions of the second active region 23b define the dimensions of the second channel region 24b. Thereafter, as illustrated by FIG. 10, a second gate insulating layer 45 is formed on the sidewalls and upper surface of the second channel region 24b. This second gate insulating layer 45 may be formed as a silicon dioxide layer by thermally oxidizing the second channel region 24b. Alternatively, the second gate insulating layer 45 may be formed using an atomic layer deposition (ALD) technique or a chemical vapor deposition (CVD) technique. Using such techniques, the second gate insulating layer 45 may be formed as an insulating layer having a high dielectric strength (e.g., silicon nitride). Moreover, prior to formation of the second gate insulating layer 45, threshold-voltage implants may be added to the second channel region 24b by implanting N-type dopants in the second channel region 24b using the second patterned hard mask layer 29c as an implant mask. The formation of the second gate insulating layer 45 may be followed by the formation of a second gate conductive layer 47 on the second gate insulating layer 45, as illustrated. The second gate conductive layer 47 may be formed as a P-type polysilicon layer, which extends opposite the upper surface and sidewalls of the second channel region 24b.

Referring now to FIGS. 1 and 11A-11C, the second gate conductive layer 47 is planarized until an upper surface of the patterned hard mask layer 29b is exposed. This planarization step results in the formation of a second gate electrode 47a. Thereafter, as illustrated by FIGS. 12A-12C, the patterned hard mask layer 29b is removed using a wet etching process. Sidewall spacers 51 may also be formed on sidewalls of the first and second gate electrodes 37a and 47a by depositing a blanket spacer layer and then selectively etching back the spacer layer (and buffer layer 27) to expose the first and second gate electrodes 37a and 47a and also expose portions of the isolation layer 25. These sidewall spacers 51 may also be used with one or more photoresist patterns (not shown) to selectively block implantation of source and drain region dopants into the first and second active regions 23a and 23b. The implantation of these source and drain region dopants (followed by a drive-in/annealing step) results in the formation of source/drain regions 49a and 49b within the first and second active regions 23a and 23b, respectively. The dose and energy levels of these implantation steps may be adjusted to account for channel regions 24a and 24b having different heights. Finally, an interlayer insulating layer (not shown) may be deposited and patterned with contact holes to enable source and drain region electrodes (not shown) to be formed, which contact the corresponding source and drain regions 49a and 49b of the illustrated transistors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
   forming an NMOS transistor having a first active region in a semiconductor substrate, said first active region having a first fin-shaped channel region therein with a first height; and
   forming a PMOS transistor having a second active region in said semiconductor substrate, said second active region having a second fin-shaped channel region therein with a second height unequal to the first height;
   wherein said step of forming an NMOS transistor comprises the steps of:
   selectively etching back a portion of a surface of the semiconductor substrate to define a trench therein that surrounds the first active region;
   filling at least a portion of the trench with an electrical isolation region that covers sidewalls of the first active region;
   selectively etching a first portion of the electrical isolation region to expose a portion of the sidewalls of the first active region, thereby to define the first fin-shaped channel region at a portion of the first active region having the exposed portion of the sidewalls; and
   forming a first gate insulating layer on the exposed portion of the sidewalls of the first active region.

2. The method of claim 1, wherein said step of selectively etching back a portion of a surface of the semiconductor substrate comprises selectively etching back a portion of a surface of the semiconductor substrate to define a trench therein that surrounds the first active region and the second active region.

3. The method of claim 2, wherein said filling step comprises filling at least a portion of a trench with an electrical isolation region that covers sidewalls of the first active region and sidewalls of the second active region.

4. The method of claim 2, further comprising the steps of:
   selectively etching a second portion of the electrical isolation region to expose a portion of the sidewalls of the second active region, thereby to define the second fin-shaped channel region at a portion of the second active region having the exposed portion of the sidewalls; and
   forming a second gate insulating layer on the exposed portion of the sidewalls of the second active region.

5. The method of claim 4, wherein the first and second gate electrode insulating layers comprise different materials.

6. The method of claim 4, wherein said step of selectively etching a first portion of the electrical isolation region comprises selectively etching the electrical isolation region to define a first trench therein having a first depth; and wherein said step of selectively etching a second portion of the electrical isolation region comprises selectively etching the electrical isolation region to define a second trench therein having a second depth, which is unequal to the first depth.

7. A method of forming an integrated circuit device, comprising the steps of:
   selectively etching back a portion of a surface of a semiconductor substrate to define a trench therein that surrounds a first active region and surrounds a second active region that is spaced apart from the first active region;
   filling the trench with an electrical isolation region that covers sidewalls of the first and second active regions;
   selectively etching a first portion of the electrical isolation region to expose a portion of the sidewalls of the first active region, thereby to define the first fin-shaped channel region at a portion of the first active region having the exposed portion of the sidewalls; and forming a first gate insulating layer on the first fin-shaped channel region;

forming a first gate electrode layer on the first gate insulating layer;

planarizing the first gate electrode layer to define a first gate electrode;

selectively etching a second portion of the electrical isolation region to expose a portion of the sidewalls of the second active region, thereby to define the second fin-shaped channel region at a portion of the second active region having the exposed portion of the sidewalls;

forming a second gate insulating layer on the second fin-shaped channel region;

forming a second gate electrode layer on the second gate insulating layer; and planarizing the second gate electrode layer to define a second gate electrode.

8. The method of claim 7, further comprising the step of implanting source and drain region dopants into the first active region using the first gate electrode as an implant mask.

9. The method of claim 7, wherein said steps of selectively etching first and second portions of the electrical isolation region are performed so that a height of the first fin-shaped channel region in the first active region is different from a height of the second fin-shaped channel region in the second active region.

* * * * *